US009453769B2

(12) United States Patent
Michael

(10) Patent No.: US 9,453,769 B2
(45) Date of Patent: Sep. 27, 2016

(54) METHOD FOR DEVELOPING A SENSING SYSTEM TO MEASURE THE ATTRACTIVE FORCE BETWEEN A MAGNETIC STRUCTURE AND ITS TARGET BY QUANTIFYING THE OPPOSING RESIDUAL MAGNETIC FIELD (ORMF)

(71) Applicant: Jim G. Michael, Parker, CO (US)

(72) Inventor: Jim G. Michael, Parker, CO (US)

(73) Assignee: Maglogix, LLC, Parker, CO (US)

( * ) Notice: Subject to any disclaimer, the term of this patent is extended or adjusted under 35 U.S.C. 154(b) by 0 days.

(21) Appl. No.: 14/828,711

(22) Filed: Aug. 18, 2015

(65) Prior Publication Data

US 2016/0187208 A1    Jun. 30, 2016

Related U.S. Application Data

(60) Provisional application No. 62/041,352, filed on Aug. 25, 2014.

(51) Int. Cl.
| | | |
|---|---|---|
| *G01D 1/00* | (2006.01) | |
| *G01L 1/12* | (2006.01) | |
| *B23Q 3/15* | (2006.01) | |
| *H01F 7/02* | (2006.01) | |
| *G01R 33/00* | (2006.01) | |
| *G01R 33/038* | (2006.01) | |

(52) U.S. Cl.
CPC .............. *G01L 1/122* (2013.01); *B23Q 3/15* (2013.01); *G01R 33/00* (2013.01); *G01R 33/0385* (2013.01); *H01F 7/02* (2013.01)

(58) Field of Classification Search
CPC .. G01L 1/122; G01G 19/4142; G01D 5/485; G01N 2203/005; G01B 7/24
USPC ................. 73/779, 862.335, 862.53, 862.69
See application file for complete search history.

(56) References Cited

U.S. PATENT DOCUMENTS

| | | |
|---|---|---|
| 4,237,455 A | 12/1980 | Beckley |
| 5,096,339 A | 3/1992 | Shoji |
| 6,072,675 A | 6/2000 | Murakami |
| 6,104,270 A | 8/2000 | Elias |
| 6,345,544 B1 | 2/2002 | Mizuno |
| 6,412,350 B1 * | 7/2002 | Swift ............ G01L 5/226 73/779 |
| 6,441,610 B2 | 8/2002 | Graff |
| 6,557,429 B1 | 5/2003 | Asquith |
| 6,636,153 B1 | 10/2003 | Barton |
| 6,941,824 B2 | 9/2005 | Morelli |
| 7,062,981 B1 | 6/2006 | Spohr |
| 7,102,476 B1 * | 9/2006 | Shen ............ B23Q 3/1546 269/8 |
| 7,201,059 B2 | 4/2007 | Lin |
| 7,234,361 B2 | 6/2007 | Lequesne et al. |
| 7,454,978 B2 | 11/2008 | Schroeder et al. |
| 7,458,276 B2 | 12/2008 | Mizuno et al. |
| 7,677,118 B2 | 3/2010 | Mizuno |
| 8,183,965 B2 * | 5/2012 | Michael ............ H01F 7/04 335/284 |
| 8,350,663 B1 * | 1/2013 | Michael ............ H01F 7/0226 29/607 |
| 8,390,271 B2 | 3/2013 | Cardone et al. |
| 8,978,487 B2 * | 3/2015 | Fergusson ........ G06F 3/03545 345/179 |
| 2004/0107777 A1 | 6/2004 | Lequesne et al. |
| 2010/0175487 A1 | 7/2010 | Sato |

FOREIGN PATENT DOCUMENTS

WO    WO 2008/032333 A1    3/2008

* cited by examiner

*Primary Examiner* — Max Noori
(74) *Attorney, Agent, or Firm* — Christopher A. Taravella

(57) ABSTRACT

The subject of this patent is a novel method for developing a sensing system that can determine a magnetic attraction force between a magnetic structure and its target level by using an Opposing Residual Magnetic Field (ORMF) to quantify said magnetic attraction force. Steps for the development and implementation of an ORMF Sensing System are set forth herein.

18 Claims, 19 Drawing Sheets

Field Comparison on Target with and without Pole Conduits

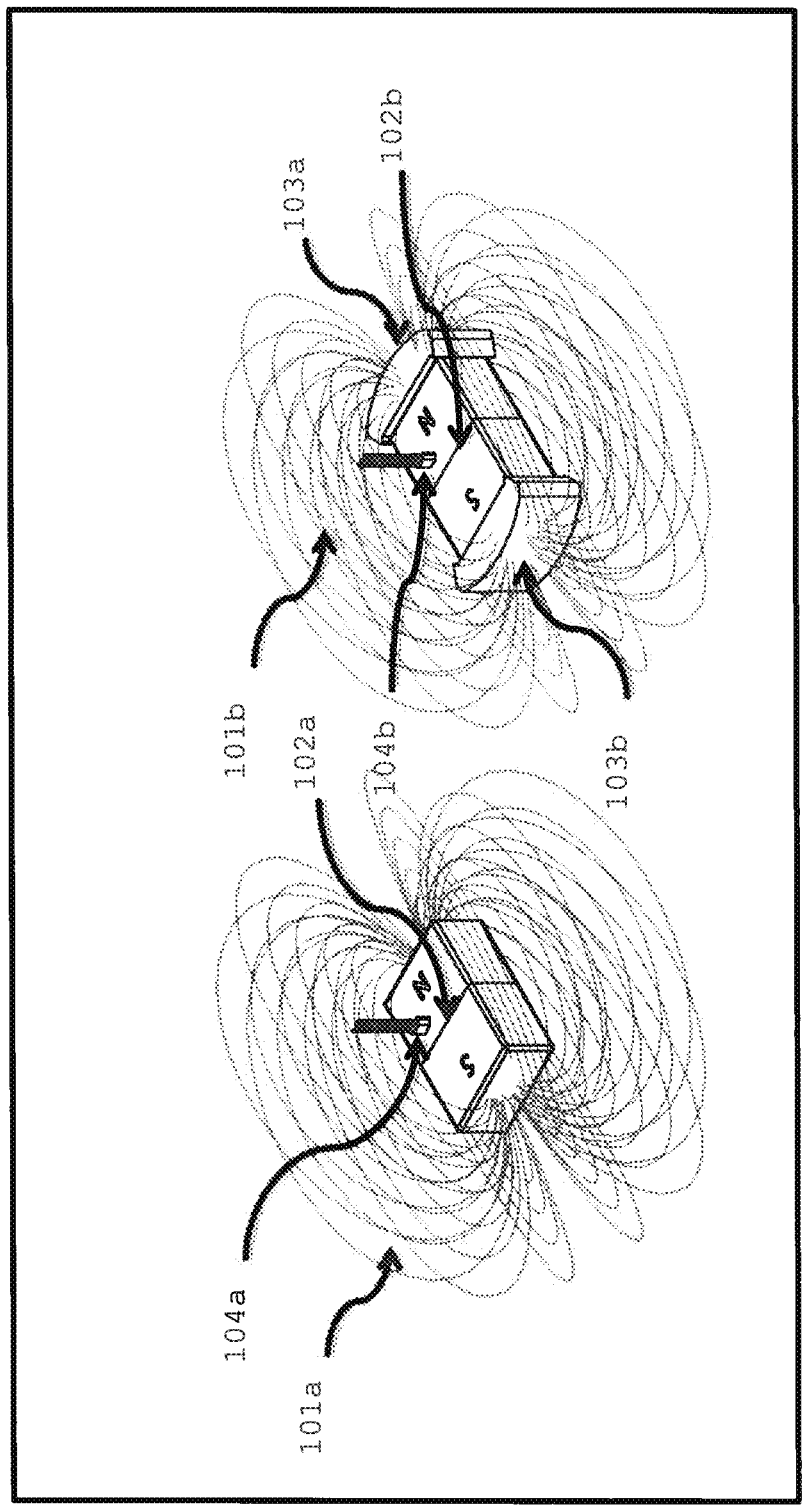
Figure 1: Permanent Magnet 3D Field with and without Pole Conduits

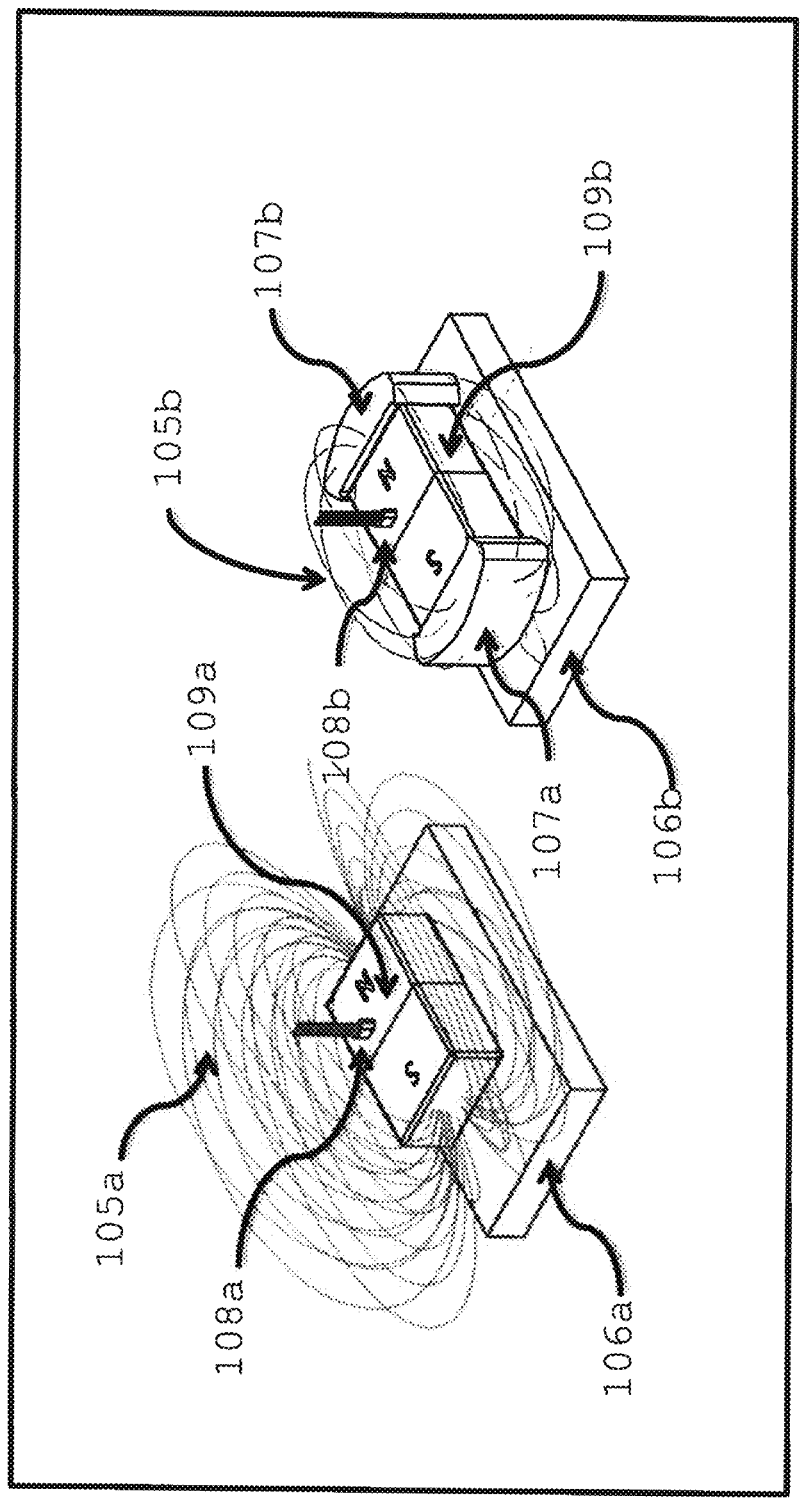
Figure 2: Field Comparison on Target with and without Pole Conduits

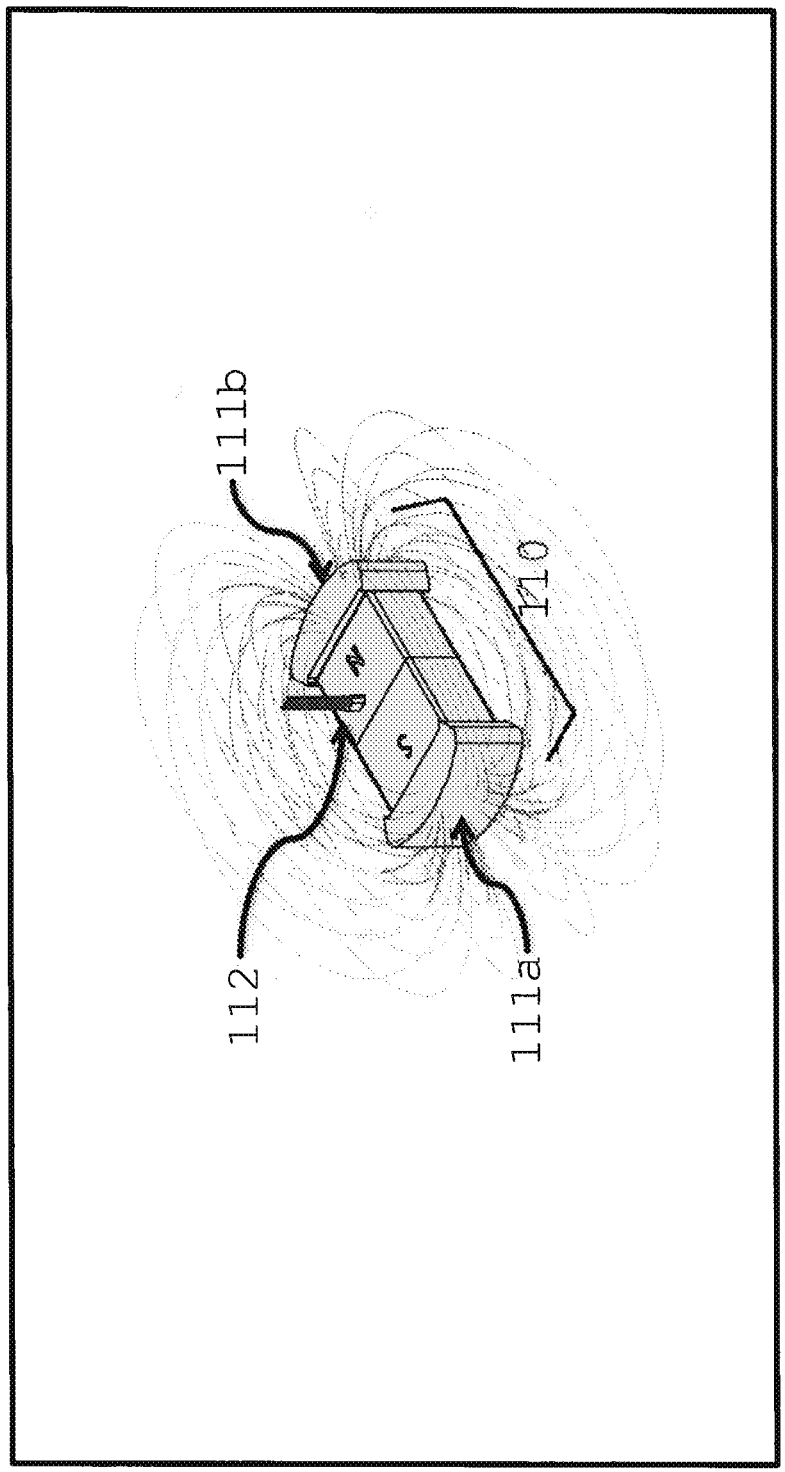
Figure 3: Magnetic Structure with Pole Conduits (Core Element) in Space

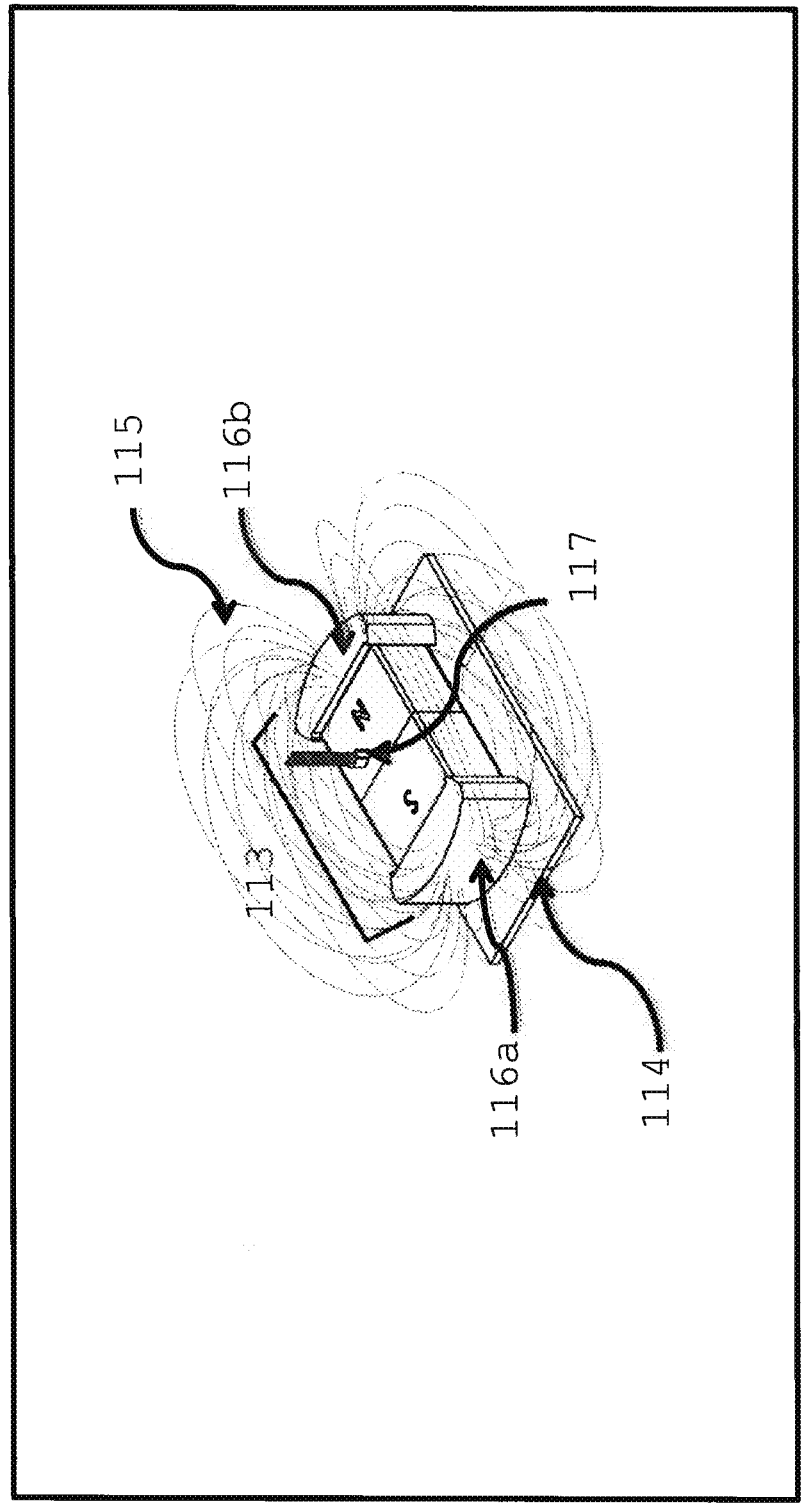
Figure 4: Magnetic Structure with Pole Conduits (Core Element) against thin Target

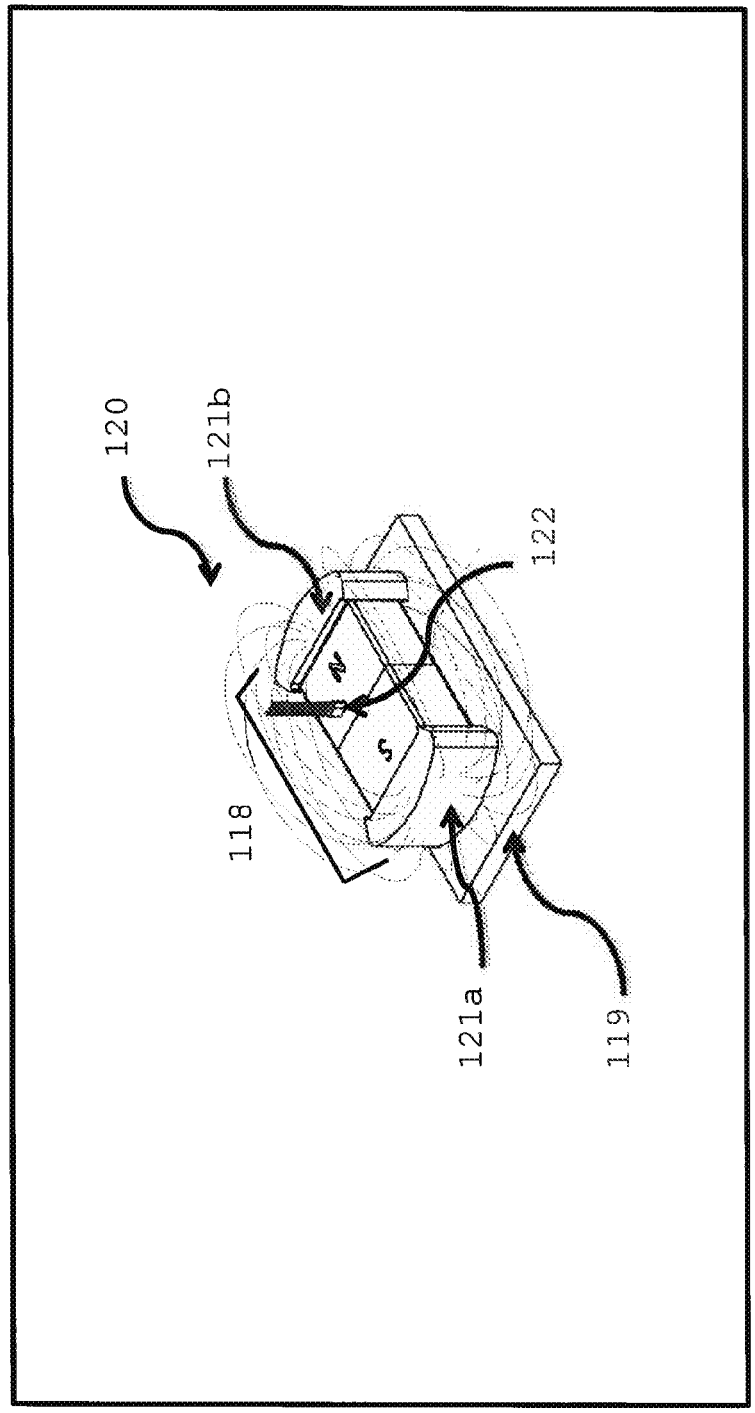
Figure 5: Magnetic Structure with Pole Conduits (Core Element) against thicker Target

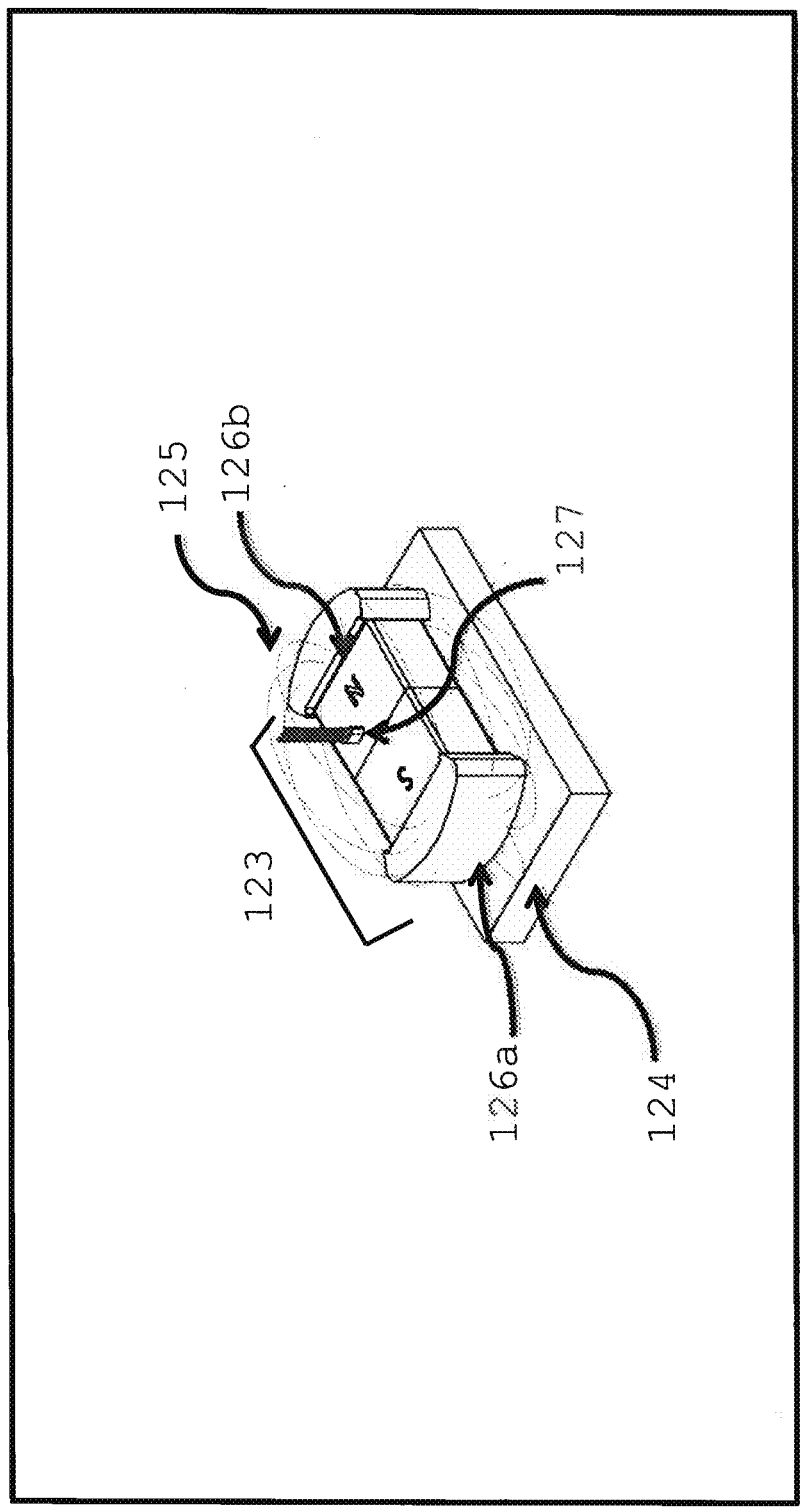
Figure 6: Magnetic Structure (Core Element) against Maximum Thickness Target

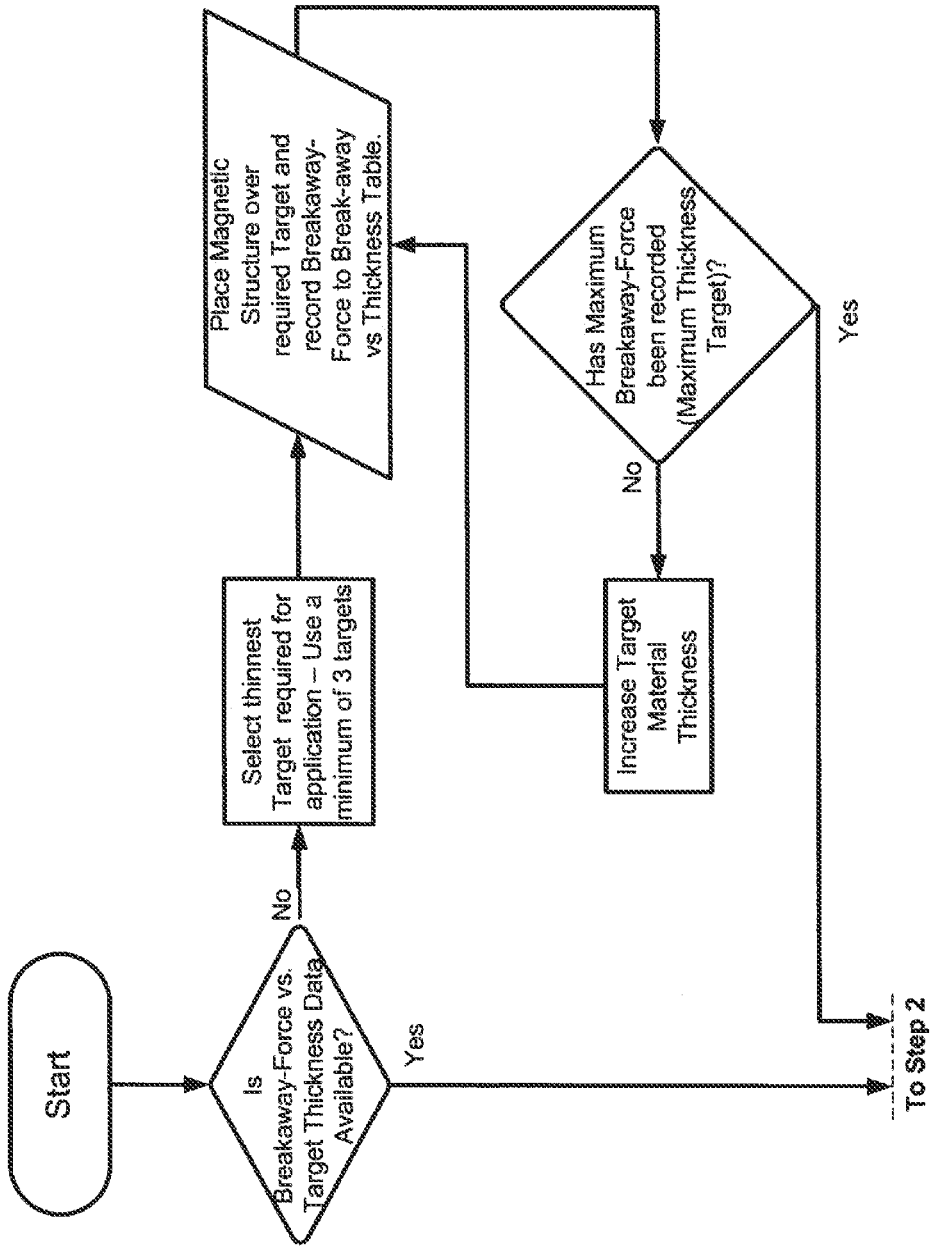
Figure 7a: Characterization of Magnetic Attachment Force versus Ferrous Target Thickness

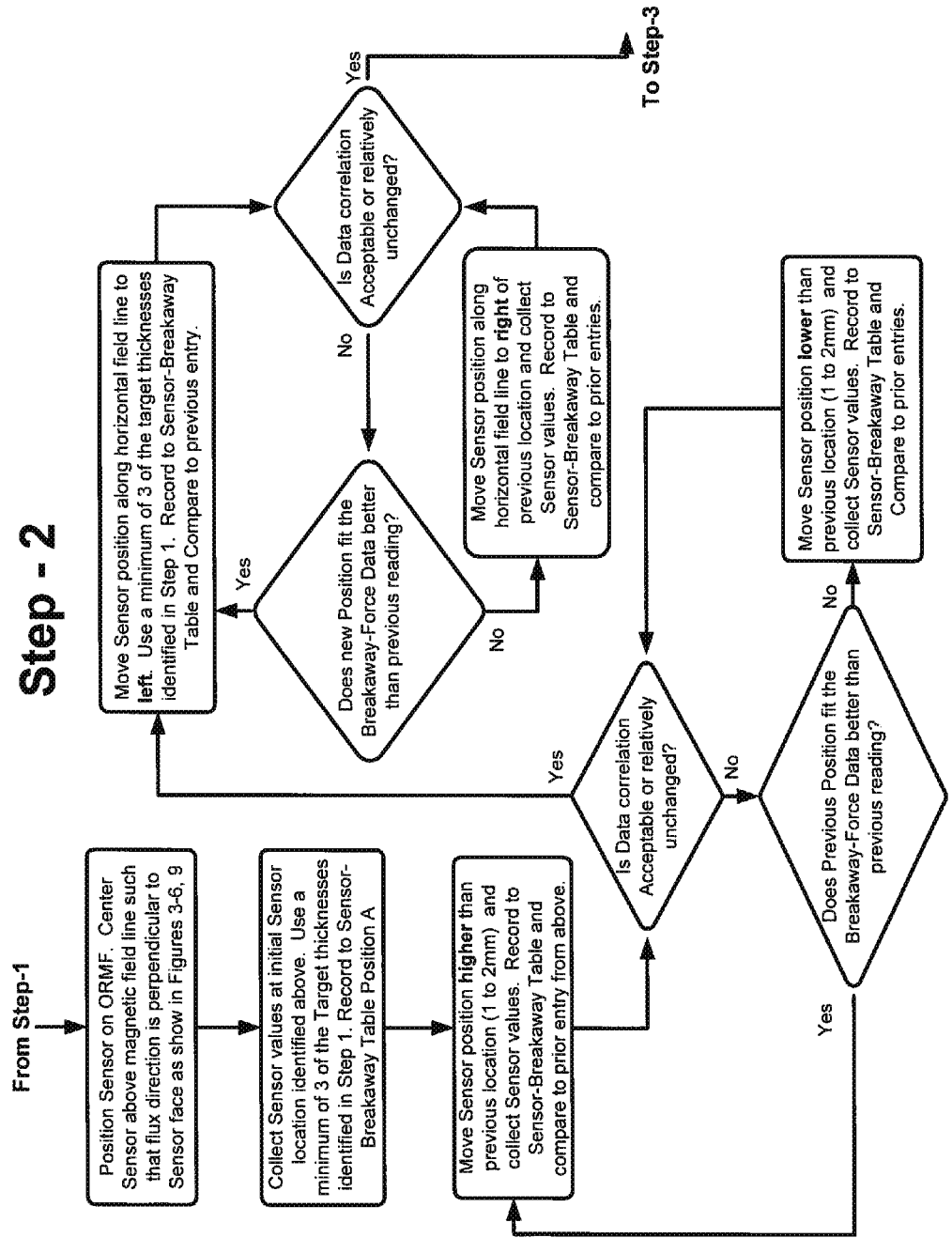
Figure 7b: Field Detection Sensor Placement

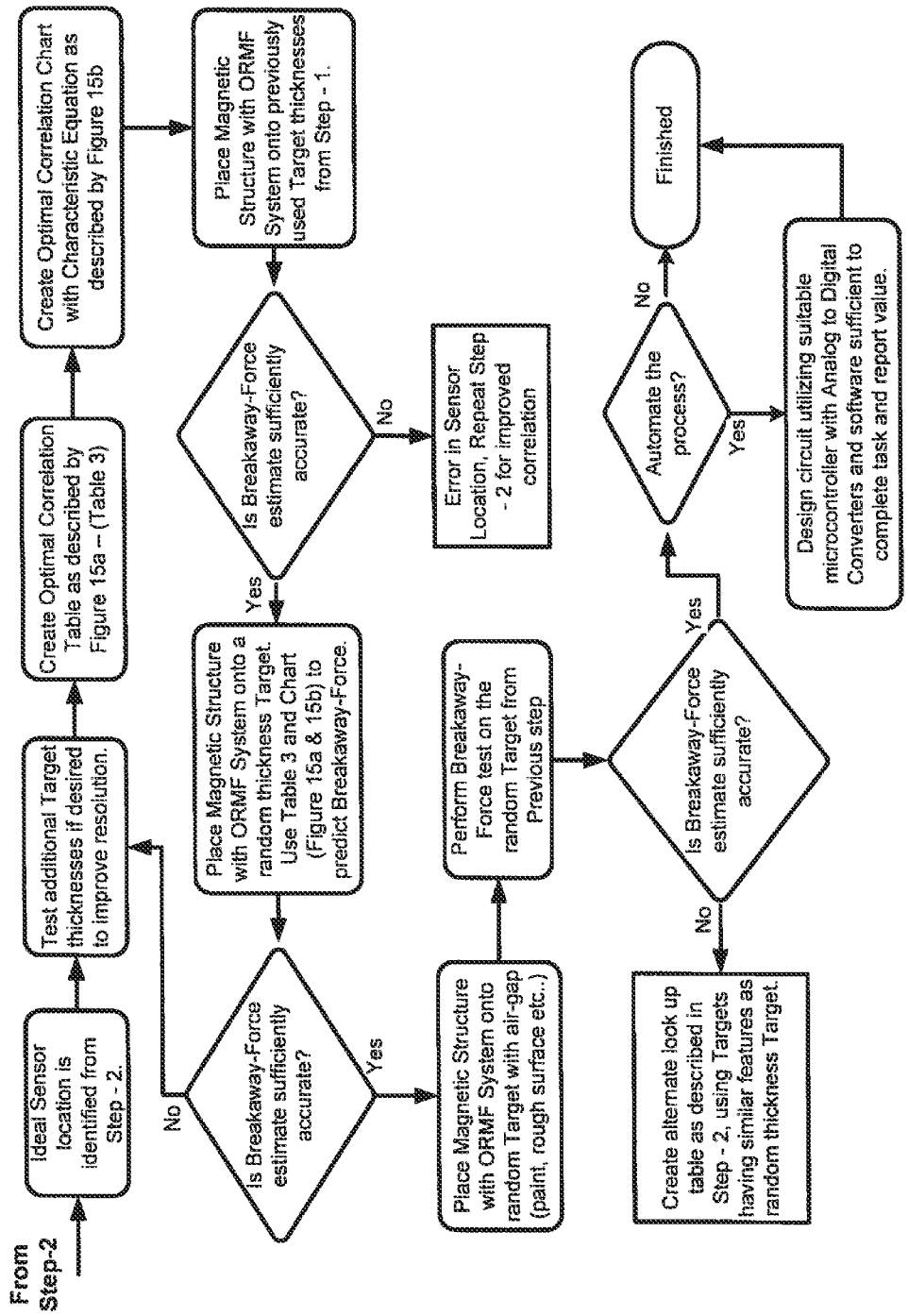
Figure 7c: Interpolation

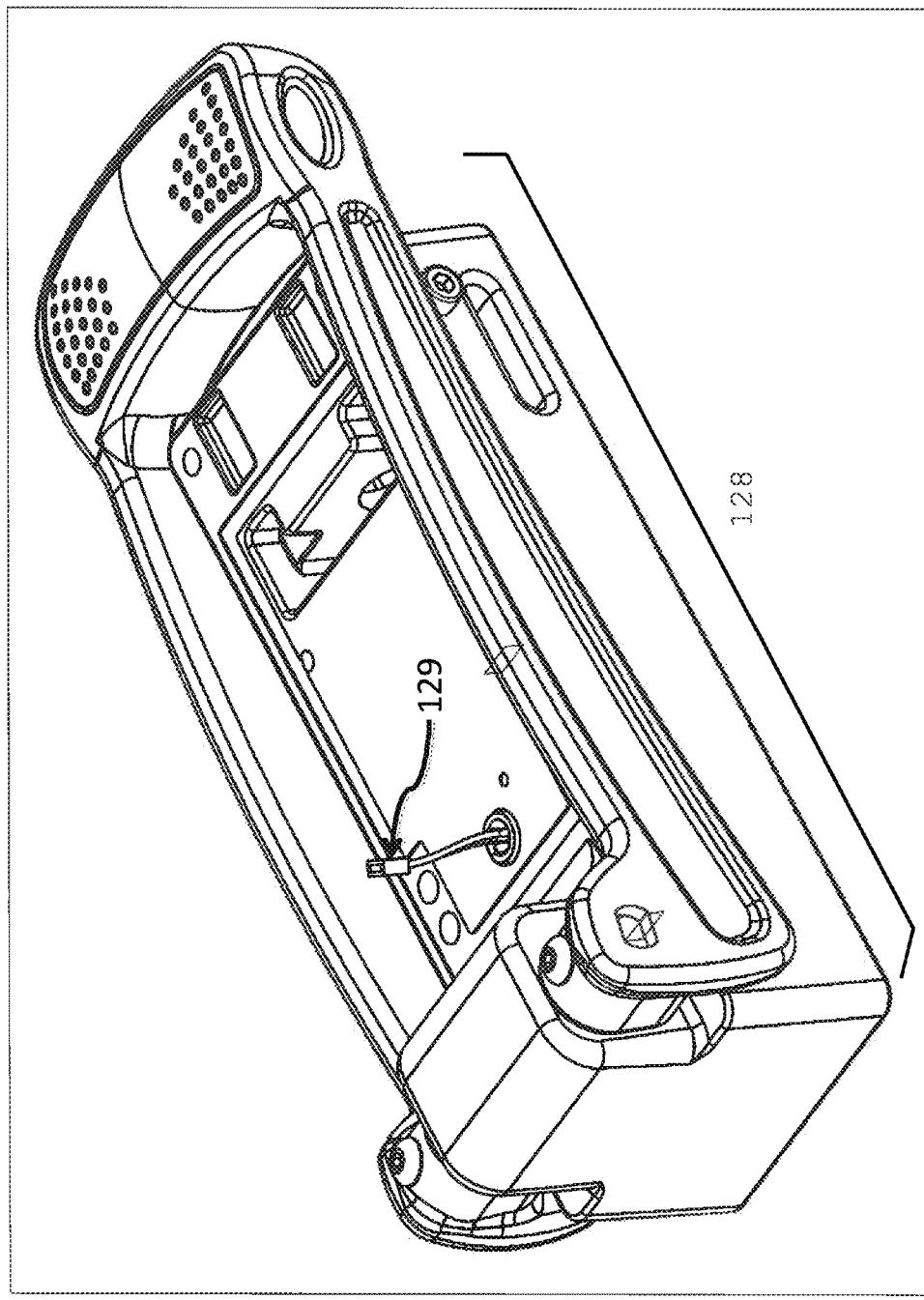
Figure 8: Permanent Magnet Base with Sensing Technology

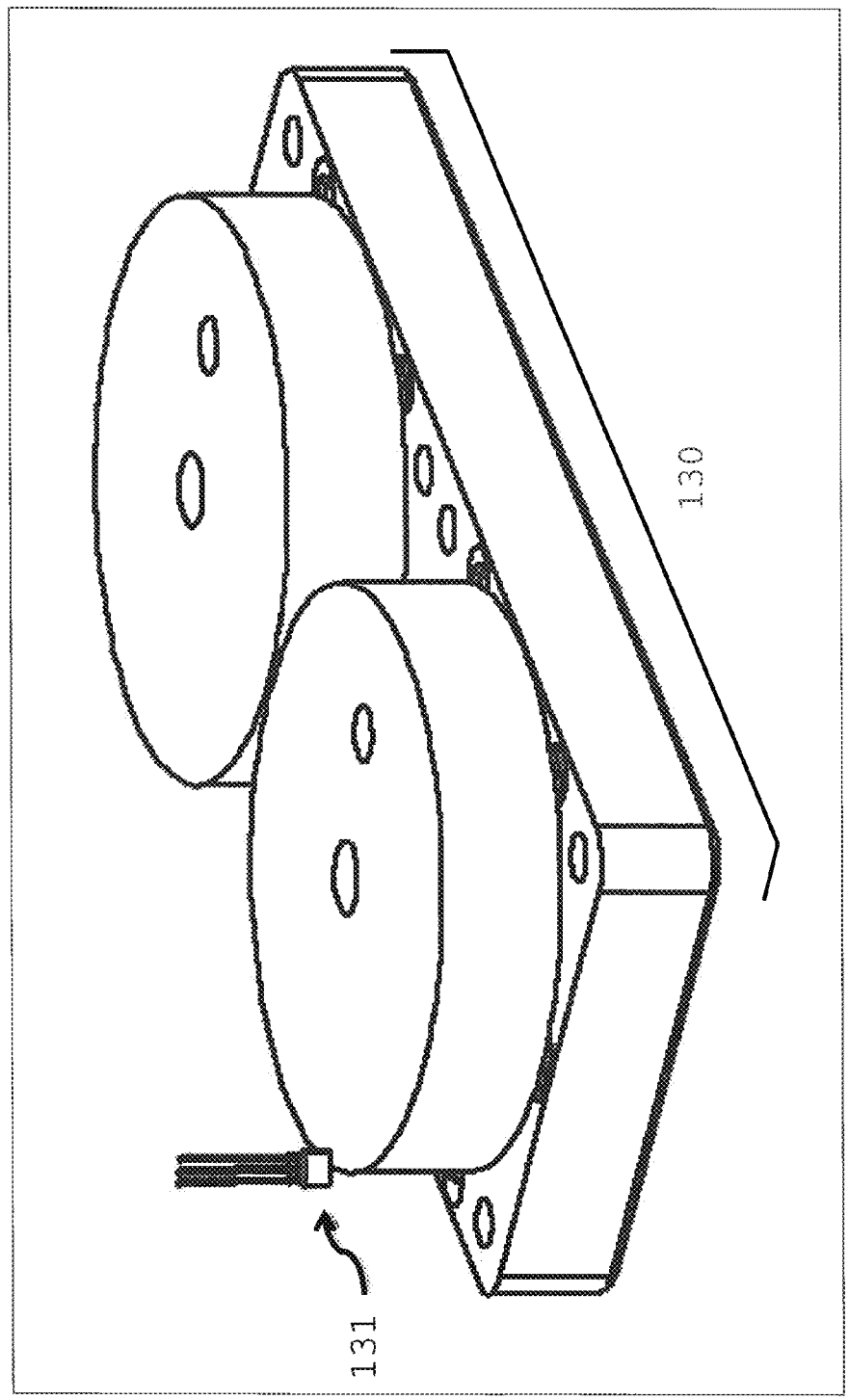
Figure 9: Switchable Permanent Magnet Assembly with Sensor Location

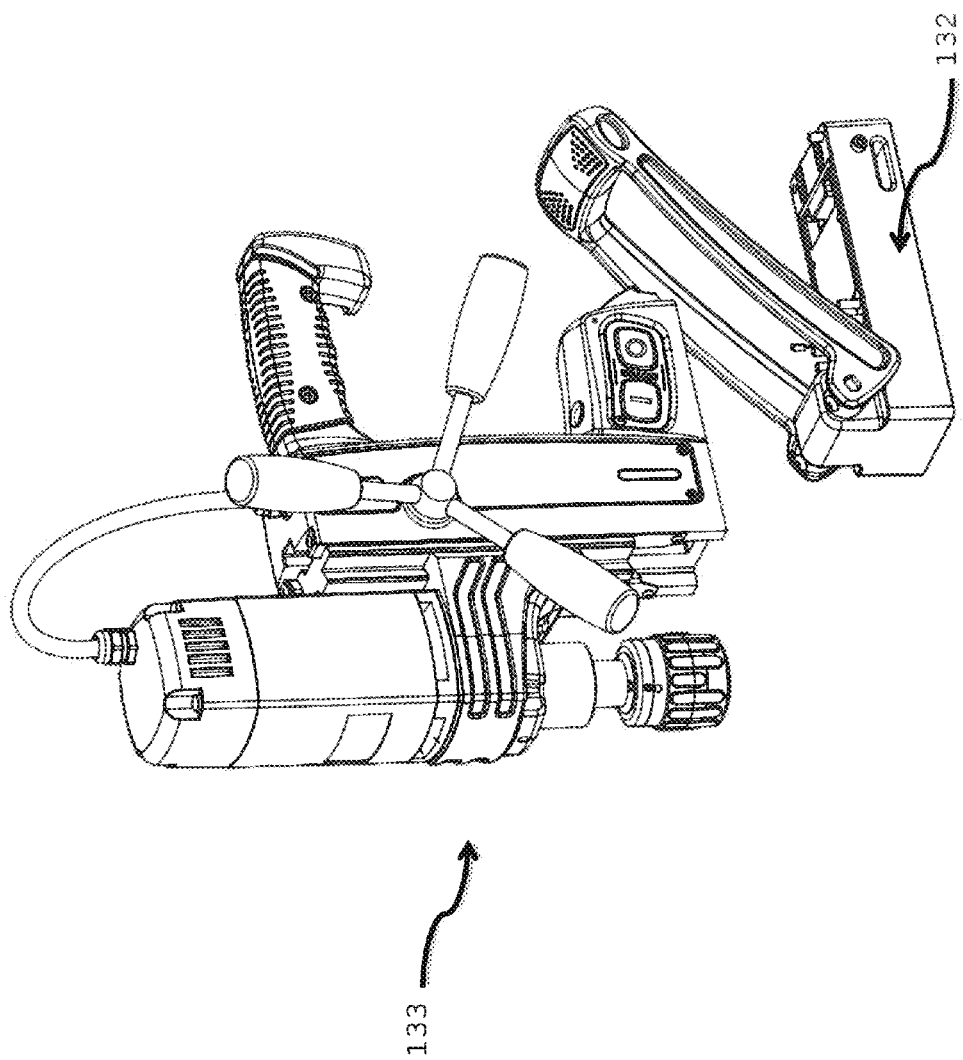
Figure 10: Switchable Magnet Structure Shown With Drill

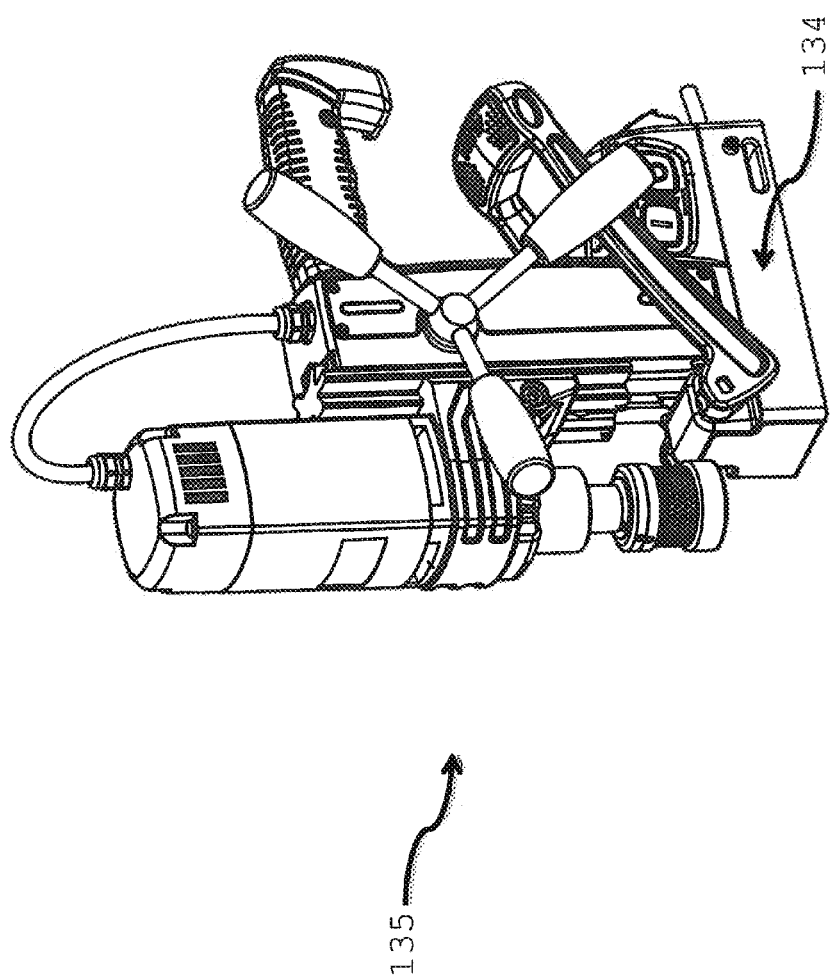
Figure 11: Switchable Magnet Structure Affixed to Drill

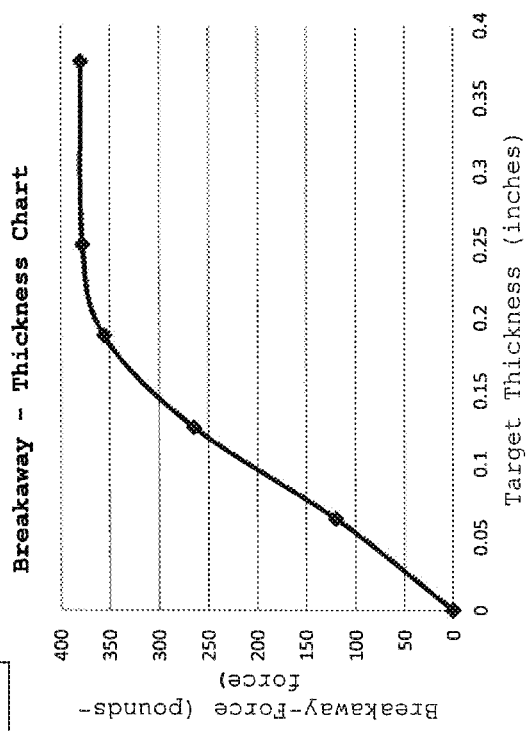
Figure 12 - Breakaway-Thickness Table 1 and Chart 1

Sensor – Breakaway Table

| Magnetic Structure (Type A) | | Gauss Level (millivolts) – at Sensor Position | | | | | |
|---|---|---|---|---|---|---|---|
| Target Thickness | Breakaway-Force (pounds-force) | A (z=0, x=0) | B (z=.1 x=0) | C (z=.2, x=0) | D (z=0 x=.1) | E (z=.1 x=.1) | F (z=.2 x=.1) |
| 0 | 0 | -225 | -187 | -175 | -190 | -260 | -228 |
| 0.0625 | 120 | -220 | -140 | -145 | -145 | -100 | -174 |
| 0.125 | 265 | -215 | -85 | -135 | -105 | -100 | -126 |
| 0.1875 | 356 | -210 | -87 | -125 | -95 | -98 | -104.5 |
| 0.25 | 378 | -210 | -86 | -125 | -95 | -95 | -103.4 |
| 0.375 | 380 | -210 | -84 | -125 | -95 | -95 | -103.4 |

Figure 13a – Table 2: Sensor-Breakaway

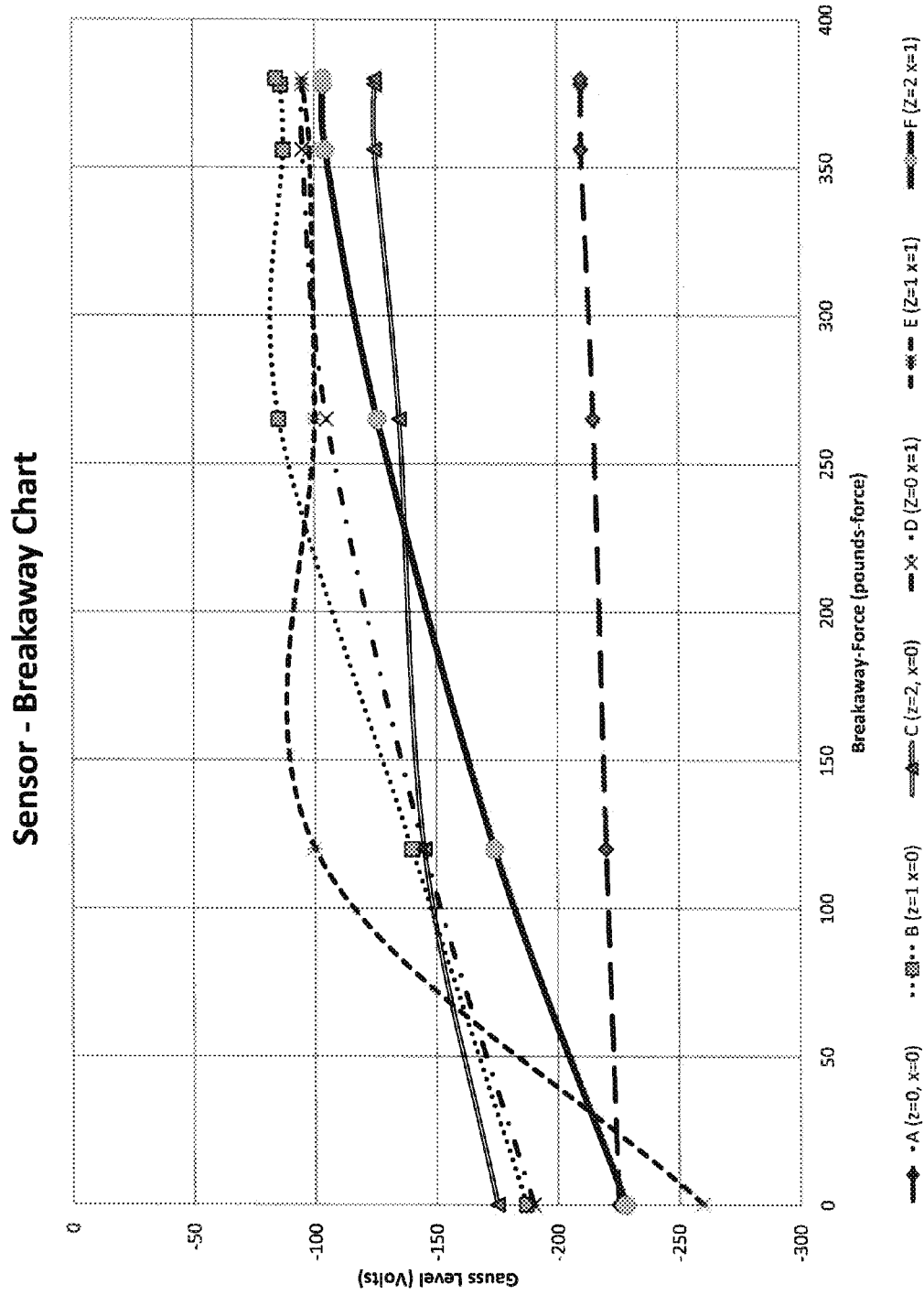
Figure 13b - Chart 2: Sensor-Breakaway

| Sensor - Breakaway Table | | | | | | | |
|---|---|---|---|---|---|---|---|
| Magnetic Structure (Type A) | | Gauss level (mVolts) - at Sensor Position | | | | | |
| | | A** (z=0, x=0) | B (z=.1, x=0) | C (z=.2, x=0) | D (z=0, x=.1) | E (z=.1, x=.1) | F* (z=.2, x=.1) |
| Target Thickness | Breakaway-Force (pounds - force) | | | | | | |
| 0 | 0 | -225 | -187 | -175 | -190 | -260 | -228 |
| 0.0625 | 120 | -220 | -140 | -145 | -145 | -100 | -174 |
| 0.125 | 265 | -215 | -85 | -135 | -105 | -100 | -126 |
| 0.1875 | 356 | -210 | -87 | -125 | -95 | -98 | -104.5 |
| 0.25 | 378 | -210 | -86 | -125 | -95 | -95 | -103.4 |
| 0.375 | 380 | -210 | -84 | -125 | -95 | -95 | -103.4 |
| Correlation Value | | 0.997 | 0.958 | 0.964 | 0.978 | 0.794 | 0.994 |
| Max Delta | 380 | 15** | 103 | 50 | 95 | 165 | 124.6* |

Note; ** While Sensor Position A had the highest correlation value with respect to Breakaway Force, it is not selected due to such a small difference (Max Delta) in Gauss level compared to Position F*.

Figure 14 -Table 3: Sensor-Breakaway Table with Correlation and Max Delta Calculations

| Optimal Correlation Table | | |
|---|---|---|
| Date: | | |
| Tester: | | |
| | Magnetic Structure (Type A) | |
| Target Thickness | Breakaway-Force (pounds-force) | Gauss (mVolts) |
| 0 | 0 | -228 |
| 0.0625 | 120 | -174 |
| 0.125 | 265 | -126 |
| 0.1875 | 356 | -104.5 |
| 0.25 | 378 | -103.4 |
| 0.375 | 380 | -103.4 |

Figure 15a - Table 4: Optimal Correlation Table

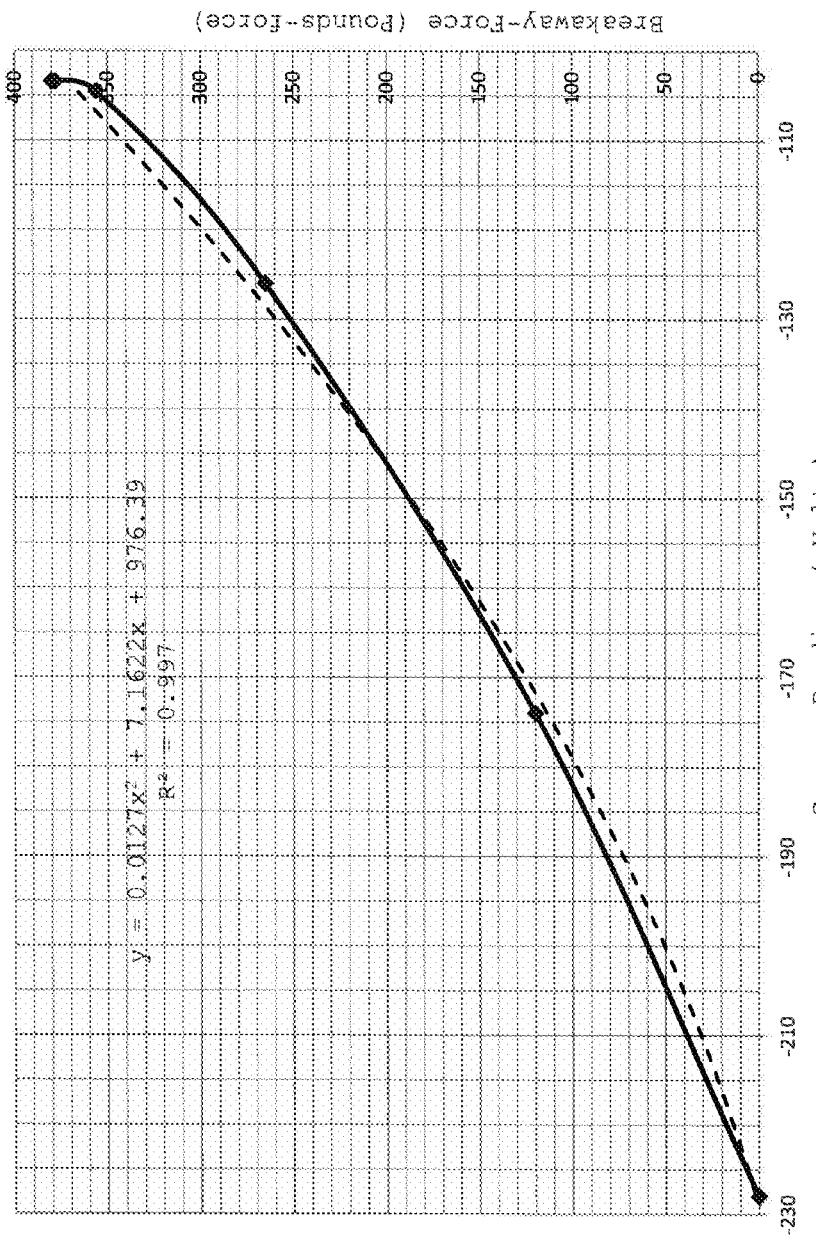
Figure 15b - Chart 3: Optimal Correlation with Characteristic Equation

METHOD FOR DEVELOPING A SENSING SYSTEM TO MEASURE THE ATTRACTIVE FORCE BETWEEN A MAGNETIC STRUCTURE AND ITS TARGET BY QUANTIFYING THE OPPOSING RESIDUAL MAGNETIC FIELD (ORMF)

Pursuant to 35 U.S.C. §119, the patent application comprising this specification claims the benefit of the filing date of a provisional application, USPTO application Number 62041352, filed Aug. 25, 2014.

BACKGROUND OF THE INVENTION

1. Field of the Invention

There is a growing need for a quantitative means to determine the magnetic force generated between a Magnetic Structure (a permanent magnet with pole conduits (properly sized high permeability ferromagnetic material) placed on the magnetic pole faces) and its Target (the ferromagnetic material to which the Magnetic Structure attaches). This need has not been adequately met due to deficiencies in current technology.

2. Prior Art

U.S. Pat. No. 4,237,455 issued to Beckley et al. (1980), Improvements in Safety Device for Lifting Magnets ("the '455 patent"), describes a magnetic field flux sensor combined with a load cell, to provide an output that is indicative of the safety margin between lifting tension and magnetic field available for lifting. The device, intended for lifting magnets, uses a "sensor means" to produce a signal representative of flux produced by a device in a magnetic circuit that includes a body to be lifted. In this design, the "sensor means" is depicted in the patent by a moveable pole piece or plunger that is moved downwardly into contact with a load through a sensing coil. The sensing coil responds to the change in magnetic field strength produced by movement of the pole piece. In theory, the signal generated by the pole piece moving through the magnetic field creates a representative signal. Many factors adversely affect the "representative signal" that the innovation fails to consider, rendering the design marginal. The velocity with which the pole piece is moved through the sensing coil becomes a critical factor to proper operation. The sensing coil will have different readings due to variations in plunger or pole piece velocities, device orientation, vibration, temperature, contamination, etc. as the plunger or pole piece moves through the sensing coil and encounters the load.

Because many factors affect the velocity with which the plunger or pole piece is moved through the sensing coil, implementation of this device is challenging. Pole piece movement is required to generate a signal (per Faraday's Law of Electromagnetic Induction). This limits the signal output from a sensing coil to a single initial reading. Once the moveable pole piece is in contact with the Target, no further flux change will occur and the sensing coil will no longer produce a voltage difference. If power is cycled or the load shifts, there would be no way to determine the holding force without moving the pole piece back to its original position and restarting the measurement sequence. This means that as a magnet lifts a Target, commonly observed load flexure may introduce an air-gap between the magnet and the Target. Such an air-gap would be undetected, as the measurement period has already transpired. What was presumed to be a safe lift may become an unstable or dangerous lift. While the construction of this device is theoretically possible, this inventor is unaware of any products that have been successfully introduced into the market that utilize the design described by this patent. This inventor does not believe that one skilled in the art can produce a useable working model of the apparatus described by the '455 patent except under ideal conditions.

U.S. Pat. No. 5,096,339 issued to Shoji (1992) describes an electromagnetic drill with Anti-Floating Control Means. The basis of the invention is to provide a sensing method that can detect when an electromagnet base begins to detach from a work Target allowing for the automated shutoff of the drill motor. The basis of the system is to detect magnetic flux levels utilizing a Hall Effect sensor located within the magnetic base in close proximity to the Target. If an air-gap between the machine base and the Target material is introduced during a drilling operation, the magnetic flux level passing through the Hall Effect sensor increases dramatically. When the flux level exceeds a predetermined threshold, integrated electronic circuitry triggers the immediate shutdown of the motor. This technology is limited to simple activation and deactivation of a device. Moreover, placement of the sensor near the Target substantially diminishes the accuracy of the measurement due to localized magnetic field distortion occurring within the Target material.

U.S. Pat. No. 7,201,059 B1 issued to Lin et al. (2007) describes a "Magnetic Force Sensor Assembly For Work-Holding Fixtures." The goal of the Lin invention is to determine whether sufficient magnetic force exists between a work-holding fixture and a base. This particular design uses a ferromagnetic component, which moves against a spring opposing the magnetic force of the magnet. When the magnetic field of the magnet is of adequate performance it overcomes the spring force and seats the component directly above a position sensor embedded in the work-holding fixture. The spring force can be adjusted to ascertain when a desired grip force has been reached. While the subject sensor assembly can provide the user with the information to determine if adequate grip force exits, the design has considerable difficulty in implementation. The sensor, positioned outside the magnetic assembly, subjects it to accidental impact and environmental damage. Differing magnet orientations have a negative impact on the sensor output. Variations in the spring-constant (due to fatigue, temperature and corrosion) diminish sensor accuracy. Moreover, the use of an excessive number of components increases the likelihood of product failure. The externally located sensor mechanism may interfere with placement of different size materials onto the work-holding fixture. While useful in some machining fixtures, its use in general applications such as below the hook lifting magnets is not recommended. Furthermore, the design does not provide an estimate of the magnetic grip but instead specifies whether and when a particular magnetic attachment force has been attained.

U.S. Pat. No. 8,390,271 B2 issued to Cardone et al. (2013) describes magnetic anchorage equipment with a self-test unit. The basis of the invention is to provide an integrated self-testing unit capable of combining data from multiple data sensors in order to provide an operator with information regarding the ability to lift a desired Target. The purpose of the system is to determine if sufficient magnetic force exists between anchorage equipment and a mold or Target material and ensure that all of the sensors are operational. This particular design uses a characteristic parameter that is proportional to the instantaneous value of the current flowing in one or more polar units identifying the anchorage surface. This unit performs its analysis the moment magnetic equipment is activated. Using magnetic flux signals originating in the coils and mathematically integrating them, a value proportional to the outgoing magnetic attachment force can be derived. Much like the '455 patent discussed above, the magnetic force level is determined only at the instant of activation. This system, in contrast to the '455 patent, does not have moving parts. Combination with the use of numerous self-testing sensors improves product performance. While this design is well suited for lifting large inflexible Targets, such as an injection mold (its intended application), it will have severe limitations when lifting Targets that flex, bend or tilt during operation as the activation process only occurs when the material is stationary and has not yet been lifted.

Thus there remains a need for a sensing method that can quantitatively determine the actual attractive force between a magnet and Target.

BRIEF SUMMARY OF THE INVENTION

It is known that a permanent magnet has a north and south pole. However, a Magnetic Structure (referred to as a Core Element in prior art U.S. Pat. No. 8,183,965 B2 (Inventor Michael, 2013) also maintains the north and south pole structures of the magnet. In this configuration, the magnetic field or flux can be readily manipulated into and out of a ferrous Target. This Magnetic Structure is therefore capable of redirecting all of its magnetic flux through a ferrous Target capable of absorbing all of the available flux. Unlike prior art inventions that attempt to measure how much flux is absorbed by a Target, this invention quantifies the remaining flux level on the side opposite the Target. By doing this, far greater accuracy is achieved, as the flux levels on the opposite side of the Target are far more responsive and much easier to quantify than the flux level on the Target side. The flux field on the Target side is often distorted when the material thickness is incapable of fully absorbing the field. The prior art magnetic field sensors then attempt to measure a field in a thin ferromagnetic Target in addition to the field passing through the Target as well as the field outside of the Target. Unless the Target is relatively flat, inflexible, unpainted (no air-gap) and homogenous, the sensor output will fluctuate considerably. The instant invention greatly simplifies the ability to accurately quantify the magnetic attachment level by looking at how much of the field is actually absorbed by the Target. Furthermore, the instant invention provides sensor readings at any time during and after activation rather than just at the time of activation. This allows for a highly dynamic sensing system capable of continuously monitoring any changes or fluctuations to the magnetic attachment force.

BRIEF DESCRIPTION OF THE DRAWINGS

FIG. 1 shows a Permanent Magnet 3D Field with (on the right) and without (on the left) Pole Conduits. Magnetic field (flux) lines 101a and 101b are represented in three-dimensional space traveling from one magnetic pole face to another magnetic pole face. The Figure illustrates how the magnetic field lines 101a of a bare magnet 102a are essentially the same as those of a bare magnet 102b with pole conduits 103a and 103b placed on the magnet pole faces. Field sensors 104a and 104b or field sensing means ("Sensor") above the magnet or Magnetic Structure would indicate a high magnetic field reading.

FIG. 2 shows a Field Comparison on Target with (on the right) and without (on the left) Pole Conduits with respect to Targets 106b and 106a and Pole Conduits 107a and 107b. Magnetic field (flux) lines are represented in three-dimensional space traveling from one magnetic pole face to another magnetic pole face with a ferromagnetic Target bridging the north and south poles of the magnet and bridging across the Magnetic Structure. The drawing illustrates how the similar magnetic fields depicted in FIG. 1 behave in a completely different manner when a ferromagnetic Target bridges across the magnetic poles. The depicted Sensor 108a above the magnet would indicate a high magnetic field reading while the depicted Sensor 108b above the Magnetic Structure would indicate a very low magnetic field reading.

FIG. 3 shows a Magnetic Structure with Pole Conduits (Core Element) in Space. Because steel is highly permeable to magnetic fields, the field easily permeates the steel of the pole conduits 111a and 111b unimpeded by its presence. In space, the north and south fields are completely contained within the pole conduits that now act to source the magnetic field of the magnet. Sensor 112 depicted above the Magnetic Structure) (Core Element 110) would indicate a high magnetic field reading.

FIG. 4, Magnetic Structure with Pole Conduits (Core Element) against thin Target shows the Magnetic Structure (Core Element 113) depicted in FIG. 3 placed on a thin Target 114. In this case, the magnetic field contained within the pole conduits 116a and 116b (due to their high permeability) saturates the thin Target 114. The remaining magnetic field 115 contained within the pole conduits continues to permeate into space. Sensor 117 now indicates a reduced magnetic field measurement. Effectively, a "collapse or reduction of the magnetic field" begins as the pole conduits redirect the magnetic fields into the Target away from the Opposing Residual Magnetic Field 115 (ORMF), i.e., the field between the pole conduits not in contact with the Target. This field 115 (ORMF) is used to quantify the magnetic attraction between the Magnetic Structure and the Target. The degree of magnetic field collapse is entirely dependent on the size and magnetic permeability of the Target. The collapse of the magnetic field 115 (ORMF) on the non-Target side of the Magnetic Structure is directly related to the attractive force between the Magnetic Structure and the Target.

Any separation or air-gap (such as paint, texture surface finish or warp) between the Magnetic Structure and the Target will result in a reduction of the fields redirected into the Target by the conduits, thereby increasing the ORMF field 115. This allows for accurate characterization of the Target attraction simply by measuring the ORMF of the Magnetic Structure.

FIG. 5, Magnetic Structure with Pole Conduits (Core Element) against thicker Target, shows the Magnetic Structure of FIG. 4 placed on a thicker Target 119. In this case, even more of the magnetic field contained within the pole conduits 121a and 121b is directed into the thicker Target 119 resulting in further reduction of magnetic field 120 (ORMF) above the Magnetic Structure 118. The reading provided by the Sensor 122 of FIG. 5 is lower than the reading provided by the Sensor 117 in FIG. 4 due to greater absorption of field by the Target 119.

FIG. 6, Magnetic Structure (Core Element) against Maximum Thickness Target, shows the Magnetic Structure 118 of FIG. 5 placed on a Maximum Thickness Target 124 (a Target with sufficient thickness capable of fully absorbing the magnetic field contained in the pole conduits such that further magnetic attraction is not possible). Magnetic fields contained within the pole conduits 126a and 126b have been fully redirected into the Target 124. From this point on, it is irrelevant if the Target 124 is thicker, as the Core Element 123 cannot direct any more of the magnetic field than it has. The reading from Sensor 127 at the ORMF 125 is now at its lowest point.

Note that the magnetic field response or behavior in the ORMF is only possible when the fields of a magnet are effectively contained within properly designed pole conduits. Without the use of pole conduits, this technology is not feasible as much of the magnetic field would be unable to redirect into a ferromagnetic Target due to the lower permeability of the permanent magnet. A change in ferromagnetic Target thickness would have little or unpredictable impact upon the magnetic field on the side opposite the Target.

FIGS. 7a 7b and 7c depict steps in a flow chart describing a method for producing an ORMF sensing system. The ORMF sensing system is a combination of a Magnetic Structure and an ORMF Sensor that has been integrated in accordance with the instant invention. These Figures detail the method used in producing a preferred embodiment of the instant invention.

FIG. 8 shows a Permanent Magnet Base with Sensing Technology. This permanent magnet base 128, a switchable permanent magnet assembly as described in FIG. 9, is within a nonferrous housing which holds the Sensor 129 at an optimal location.

FIG. 9 shows a Switchable Permanent Magnet Assembly with Sensor Location. The Switchable Permanent Magnet Assembly 130 uses a multi-pole magnet assembly comprised of multiple Core Elements of the type described by U.S. Pat. No. 8,183,965 B2 (Inventor Michael) (2013). The Sensor 131 location is shown positioned in space for clarity.

FIG. 10 illustrates a Switchable Magnet Structure Shown with Drill. The drawing shows a permanent magnet base with sensing technology 132 described in FIG. 8, separated from the Drill Body 133.

FIG. 11 illustrates a Switchable Magnet Structure Affixed to Drill. The drawing shows a permanent magnet base with sensing technology 134 shown in FIG. 8, attached to a drill body 135.

FIG. 12 illustrates Breakaway-Thickness Table 1 and Chart 1. This is used in Step—1 of the method to describe the relationship between the Breakaway-Force of the Magnetic Structure and the Target thickness.

FIG. 13a—Table 2: Sensor-Breakaway is a table used to compare the Sensor readings of the ORMF at different positions relative to the Magnetic Structure. Its use is described in more detail in Step—2.

FIG. 13b—Chart 2: Sensor-Breakaway is a chart that plots out the data collected in FIG. 13a. It is used to provide a visual comparison of the Sensor readings of the ORMF at different positions relative to the Magnetic Structure. Its use is described in more detail in Step—2.

FIG. 14—Table 3: Sensor-Breakaway Table with Correlation and Max Delta Calculations represents a mathematical analysis of the data provided in FIGS. 13a and 13b. Ideal Sensor position is selected with the aid of this Table.

FIG. 15a—Table 4: Optimal Correlation Table is an extraction of the specific data in FIG. 14 for the optimal Sensor position selected.

FIG. 15b—Optimal Correlation Chart with Characteristic Equation, is a graphical representation of Table 4, the Optimal Correlation Table. The X and Y axes of this Chart have been reversed from those depicted in the Chart of FIG. 13b in order to allow for direct solving of the estimated Breakaway Force (shown in the Y-Axis) using the Sensor reading. The characteristic equations in this Chart can be simply solved by substituting the Sensor value (X) in the equation that best describes the plotted Breakaway-Force Data that was measured in Step—1. Using the Optimal Correlation Chart, a predictive model can be used to provide an accurate estimate of the magnetic attraction level based on flux density measured (voltage output). This model can then be integrated with additional electronics, into an automated control systems as well as providing rudimentary operator feedback using a sensory output (audible, visual or haptic).

DETAILED DESCRIPTION OF THE INVENTION

Foundation

FIG. 1 depicts two identical permanent magnets, one with pole conduits (the right side of FIG. 1) and the other without (the left side of FIG. 1). For a detailed explanation and understanding of pole conduits, refer to U.S. Pat. No. 8,183,965 B2 (Inventor Michael) (2012) and U.S. Pat. No. 8,256,098 B2 (Inventor Michael (2012). A Sensor is placed along the magnetic field line above the permanent magnet to detect the magnetic field passing perpendicularly to the magnetic field plane. Magnetic field or flux lines are depicted in three-dimensional space traveling from one pole face or pole conduit to the other. In a preferred embodiment, the Sensor is a Hall Effect Sensor.

One skilled in the art of magnetics can readily design the relative size and composition of the pole conduits. Pole conduits can be made of a wide range of ferrous materials that have a relative permeability substantially greater than the relative permeability of the permanent magnets. As an example, pole conduits can be successfully produced out of alloy steels (relative permeability of ~50) or high permeability materials such as pure iron (relative permeability of >5000) or even very high permeability exotic alloys such as Mu Metal (relative permeability>25,000). The permanent magnets used in the preferred embodiments have a relative permeability of approximately 1.05; however virtually any other magnetic material may be used. In addition, an electrically generated magnetic field such as an electro-magnet may be used as well.

FIG. 2 shows the same Magnetic Structure as in FIG. 1, but with a relatively thick ferrous or steel Target bridging the magnetic poles. The image on the right side of FIG. 2 is a Magnetic Structure with a Maximum Thickness Target bridging across the pole conduits. This configuration is often used in traditional switchable permanent magnets and is commonly referred to as a shunt, and the magnet assembly as a shunting switchable permanent magnet. One example of these magnets is the typical magnetic bases used to hold a dial indicator for measuring and often has a front dial that rotates 90°.

As depicted in FIG. 2, the magnetic field 105a on the left side is minimally affected when pole conduits are not used. When pole conduits are used (as shown on the right side of FIG. 2), the magnetic field 105b above the Target has almost been completely redirected through the steel Target. Prior art often positions a sensor in proximity to the Target in order to obtain a reading. This is not only difficult as the Targets are frequently removed and repositioned, but reduces accuracy and sensitivity. Sensors placed in close proximity to the Target are influenced by the Target shape, which often drastically alters the magnetic flux field direction, density, and shape-making a reliable measurement difficult.

The primary benefit of using pole conduits in the Magnetic Structure is to allow for the absorption and redirection of the magnetic field within the permanent magnet 109a and 109b. The pole conduits redirect the magnetic field perpendicularly through the Target until either the entire magnetic field is absorbed by the Target or it can no longer accept additional magnetic flux. When the Target can no longer accept additional magnetic field, the Target is considered saturated.

Newer, more efficient switchable permanent magnet technologies use field cancelation rather than the shunt principle illustrated in FIG. 2. These technologies (some examples are described in U.S. Pat. No. 8,350,663 B1 (Inventor Michael) (2013), U.S. Pat. No. 7,161,451 B2 issued to Shen (2007) as well as U.S. Pat. No. 7,012,495 B2 issued to Kocijan (2006)) exhibit unique magnetic characteristics which respond predictably when the magnet is placed onto a ferrous Target. While the present invention is geared primarily for use with field cancellation technology, it has been successfully demonstrated to work on other magnetic attachment technologies that use pole conduits, such as electro-magnets and electro-permanent hybrid magnets, as well as shunting magnets.

Magnetic field lines are highly influenced and altered when a ferromagnetic Target is positioned nearby. A ferromagnetic Target, placed on or near the pole conduit face, will cause the magnetic field to redirect to the path of least resistance. Relative permeability of the Target is only one of the factors affecting the magnetic field redirection. Other factors greatly influence the magnetic field redirection. Material thickness, porosity, surface finish, crystalline structure, alloy composition and shape are just a few of the factors that influence how much of the magnetic field is redirected through the Target. As an example, a thin ferrous Target may only be capable of absorbing 20% of the total available magnetic field, leaving the remaining 80% emanating above the poles as well as below the thin ferrous Target (commonly referred to as "flux leakage"). Even for thicker Targets, the introduction of a small air-gap (which may be caused by paint or non-ferrous surface coating) substantially reduces the magnetic field redirected through the Target and consequently increases the magnetic field emanating into the area surrounding the Magnetic Structure. Shape also has a dramatic effect. The use of prior art technology is prone to error if the sensor is positioned over a Target thickness that is non-representative of the average thickness of the Target. For example, assume that the magnetic Target is a common steel I-beam used in building construction. When a prior art sensor is placed on the flange of the I-Beam above the vertical web, the sensor would indicate a much higher attraction force than is actually available. Conversely, if the sensor is placed over a thinner section of the I-beam, the sensor may indicate an unsafe lift, when in fact the lift is safe.

While a sensor placed in close proximity to a ferromagnetic Target allows for some level of quantification, many factors can improperly influence the resultant readings that often lead to an overestimation of the actual attractive force between the ferromagnetic Target and the Magnetic Structure. This invention compares the field between the pole conduits not in contact with the Target to quantify the magnetic attraction between the Magnetic Structure and the Target. The ORMF reliably assesses the total reduction in the magnetic field between the opposing pole conduits. The magnetic attachment force of an irregularly shaped ferromagnetic Target can be readily quantified by evaluating how much of the magnetic field remains in the ORMF. The level of drop in the opposing residual magnetic field is a very accurate indicator of the total amount of magnetic field absorbed by the ferromagnetic Target (and thus, the total magnetic attachment force). This method is impervious to the factors which negatively affect the prior art technologies. Additionally, as magnetic field lines continuously emanate, the ORMF does not fluctuate with time unless the Target begins to separate. The ORMF method allows for continuous monitoring of the attraction force. The ORMF method can provide constant feedback to the operator as well as feedback used in control loops for automated equipment response.

The extent to which magnetic field redirection occurs is due to the ability of the Target to absorb the field of the Magnetic Structure. Very thin ferrous or nonferrous Targets absorb little or no field and thus leave the ORMF relatively undisturbed. Thicker ferrous Targets may completely absorb the entire field of a Magnetic Structure, which in turn leaves the ORMF with little or no field; the greater the reduction in the ORMF, the greater the attractive force between the Magnetic Structure and the Target. The use of a Sensor allows for simple, low cost, continuous characterization or quantification of the ORMF.

A simple analogy follows: assume that one desires to measure the density of a sponge having a complex shape and known weight. The sponge is placed into the larger of two tanks containing water, which are connected to each other by a pipe or "conduit." The smaller tank feeds water into the larger tank but is isolated from movement or disruption of water in the larger tank. The sponge absorbs water unevenly and pivots unevenly in the larger tank, making it difficult to ascertain the amount of water displaced in the larger tank. Rather than attempting to measure the volumetric change of the water in the larger tank into which the sponge is placed, the instant invention simply monitors and measures the change in the level of water in the smaller tank. This provides for a far more accurate measurement as the water displacement is amplified, and facilitates the measurement since there is no disruption in the smaller tank caused by the sponge.

Applying this analogy to the extant invention, assume that the Target is the sponge and the water is the magnetic field. The larger tank is in contact with the Target and the smaller tank is the side opposite the magnetic field ORMF. The pipe or conduit is the pole conduit. Current magnetic attachment measurement methods (prior art) attempt to read the signal as close to the Target as possible, essentially taking the measurement in the larger tank containing the sponge. The sponge, being in a state of flux, mandates that the inventors of the prior art technologies attempt to "normalize" the data. Prior art technologies must incorporate additional constraints during the measurement often-using terms such as "rate of change" or "integrated at moment of activation." The instant invention instead measures a very constant field, which is repeatable and measurable at any given time.

Generally, a single Sensor will provide sufficient accuracy because the ORMF naturally averages deviations at the interface between the Target and the Magnetic Structure quite well. Assuming similar surface characteristics, the scaled measurement is quite accurate. This is a dramatic contrast when compared to a sensor in near proximity to the Target.

Alternatively, should the need arise for a more complex system analysis, the use of multiple sensors will provide a more accurate assessment of the overall attraction force. It should be noted that although a Sensor characterizing the magnetic field at a single position and characterizing a single magnetic field is depicted, the actual force may be scaled to reflect any number of Magnetic Structures through simple multiplication and with the assumption that each is generating a similar magnetic attraction force. As an added benefit, the instant design addresses Target peel away on one side of the Magnetic Structure quite well because the ORMF is uniformly disrupted during such an event. (Peel away takes place when metal bends away from the lift point or magnet during lifting causing an uneven air-gap where the Target bends away from the magnet. This can often lead to catastrophic detachment of the Target from the magnet.)

Method Steps

Several steps are key to understanding how to develop an ORMF Sensing System. The goal of this system is to allow the user to be able to place a Magnetic Structure containing the ORMF Sensing System onto a Target and read a Sensor output, which provides an accurate magnetic attraction force value (analog or digital). (This value (voltage), can then be used as part of a control system or simply provided to an end user, e.g., an equipment operator). Step—1 characterizes the magnetic attachment force with respect to the Target thickness. Step—2 identifies the best sensor position using the particular Magnetic Structure for the Target thicknesses used in Step 1. Step—3 interpolates the data from Step—1 and Step—2 so that the reading from the Sensor is directly converted to an equivalent magnetic attachment force. A final table is created which relates Sensor voltage or output, breakaway force and material thickness at the best Sensor location as determined by Step—2. The data of the final table can then be further integrated with electronics into other machinery to provide continuous data (to the operator or to a microprocessor for further automation). The steps are described in detail below as well as in the basic flow charts of FIGS. 7a, 7b, and 7c.

Step—1: FIG. 7a: Characterization of Magnetic Attachment Force Versus Ferrous Target Thickness Attachment of a ferrous Target to a Magnetic Structure is primarily dependent on the Target and the amount of magnetic field that the Target can absorb as well as the magnetic field level provided by a given Magnetic Structure. The attachment force is characterized by observing the relationship between the Magnetic Structure and various thicknesses of ferromagnetic Targets. At a minimum, a breakaway tester and various thicknesses of similar ferrous Targets are needed. A breakaway tester, in this application, is simply an apparatus used to measure the normal (perpendicular to Target) force required to detach a magnet from a Target. Breakaway tests are performed using ferrous Targets of increasing thickness. Each test is conducted by providing a slowly increasing tensile force to the Magnetic Structure until the Magnetic Structure breaks away from the restrained Target. This is known as the Breakaway-Force. The Breakaway-Force for each material thickness is recorded as depicted and graphed in FIG. 12 Breakaway-Thickness Table 1 and Chart 1. The use of equal incremental changes in Target thickness may facilitate the optimization of the Sensor location for Steps—2 and 3 later. When further increases in Target thickness do not result in an increase in the Breakaway-Force, maximum performance of the Magnetic Structure has been reached. Consequently, testing thicker materials beyond the maximum performance level becomes superfluous, as the Breakaway-Force will continue to remain the same. The point at which the holding force no longer increases with Target thickness is often described as the Saturation Thickness for a Magnetic Structure. See Step—1: FIG. 7a—Characterization of Magnetic Field versus Ferrous Target Thickness.

Plotting the data in Table 1, FIG. 12 using an XY Scatter chart, one can compare Breakaway-Force with respect to Target thickness. A curve can then be plotted as shown in FIG. 12. Most generally, this curve can be modeled with a second order equation, particularly if the data is limited to the range between zero and the thinnest Saturation Thickness Target for the Magnetic Structure being characterized. If increased accuracy is desired, a higher order equation or a look up table containing substantially more data points could also be used. This data will be used as a basis for Step—2 for each of the Sensor positions being evaluated.

Step—2: FIG. 7b: Field Detection Sensor Placement

To characterize the behavior of the ORMF, a Magnetic Structure is first placed onto a non-ferrous surface such as wood or plastic in order to obtain the Sensor voltage at the zero Target thickness level (also the zero Breakaway-Force level).

An analog to digital (A/D) converter may also be used to convert the analog voltage signal from the Sensor (here, a Hall Effect Sensor) to a digital value. Characterization of the Hall Effect sensor in FIG. 9 (shown without locating components for clarity) is selected based on Step—2 in the Method for Producing the ORMF Sensing System depicted in FIG. 7b.

In this preferred embodiment, which uses a multi-pole magnet assembly of the type described by U.S. Pat. No. 8,183,965 B2 (Inventor Michael) (2013), the Sensor is a Hall Effect sensor. It is positioned in a convenient and optimal location opposite a Target-Magnetic Structure interface (ORMF). Careful positioning of the Hall Effect Sensor is critical to provide the most accurate picture of the ORMF. Sensor output will be directly correlated to the magnetic attachment force between the Magnetic Structure and the Target using the ORMF. While this location does not provide the maximum voltage range between no-Target and a fully saturated Target, it provides for maximum voltage separation between Targets of various thicknesses from 0.0625 inches to 0.375 inches as seen in FIG. 13a—Table 2: Sensor-Breakaway table. In this instance, the optimal sensor output is determined to be 0.1 inches away from the circumference of the outer diameter and 0.2 inches directly above one of the magnetic pole field lines within the rotatable portion of the upper multi-pole carrier platter as shown in FIG. 9 (See U.S. Pat. No. 8,350,663 B1 (Inventor Michael) (2013)). The angle of the Sensor is also positioned perpendicular to the magnetic field line emanating from the pole conduits below it (not shown). It should also be noted that several positions along the circumference of the upper platter performed identically (primarily over the adjacent magnetic poles within the multi-pole carrier platter). Sensor location was based on which of the locations offered the most convenient installation which also offered acceptable performance.

An improper sensor location is readily identifiable when there is poor correlation between the Breakaway-Force and the Hall Effect output voltage with respect to thickness. Issues such as a change in the Breakaway-Force being observed without a change in voltage (or vice versa) are indicative of poor Sensor location. It is recommended that a chart be produced to provide a visual representation of the data as described in FIG. 13b—Chart 2: Sensor-Breakaway and FIG. 13a—Table 2, the Sensor-Breakaway table. The Sensor-Breakaway data, at a minimum, must identify the ORMF levels relative to the different thicknesses, for the various locations under evaluation. If satisfactory results are obtained, equations can then be fit to the chart data (up to the saturation thickness). Each specific application and/or Magnetic Structure must be evaluated for suitability across the range of material for which the device is to be used.

Step 3: FIG. 7c: Interpolation

Ideal sensor location has been identified in this example as position F (z=0.2, x=0.1) shown in FIG. 14—Table 3: Sensor Breakaway Table with Correlation and Max Delta Calculations. This position is where the Sensor readings (voltage) at each of the different thicknesses in the table, best correlate with the change in Breakaway-Force recorded in Step 2. Additionally this position maximizes the voltage difference in the Target thickness range of interest.

A curve fitting function can be used to determine the characteristic equation, which is used to quantify the magnetic attractive force with respect to the Sensor reading (see FIG. 15b—Chart 3: Optimal Correlation with Characteristic Equation). Once the curve or Chart for the Magnetic Structure's attractive force is created, the Magnetic Structure can be placed on any surface and an accurate estimate of the magnetic attraction force can be interpolated from the data. An example of this can be shown using FIG. 15a—Table 4: Optimal Correlation Table and FIG. 15b—Chart 3: Optimal Correlation Chart with Characteristic Equation. If the Magnetic Structure with the ORMF System is placed on an unknown Target and a voltage reading of −150 millivolt (mVolts) is output, one can make a determination of the Magnetic Attractive force by simply locating where −150 mVolts on the X axis intersects the curve and then reading the corresponding Breakaway Force on the Y-Axis. This simple procedure would estimate a value of just less than 200 pounds-force. A microprocessor could solve the polynomial equation, which fits the curve shown in the FIG. 15b, and calculate a value of 187.8 pounds force using a second order polynomial equation. Note that the axes in this chart are reversed from those of FIG. 13b in order to ascertain a Breakaway-Force (Y-value) by using a Sensor reading (X-value) thereby simply solving for Y in the equation describing the curve depicted in FIG. 15b. See Step—3 depicted in FIG. 7c, for a flow chart diagram describing this process. It is important to note that this data is not used to measure thickness (except under ideal conditions) but rather to provide an estimate of the attractive force between the Magnetic Structure and most non-deal Targets.

Applications

Should the Target surface be irregular in any manner, or have an air-gap due to paint or irregular surface, the ORMF will reflect this by being at a higher level and subsequently the Hall Effect sensor will output a voltage lower than expected for a material of this thickness. It is important to note that the voltage direction of a Sensor can be reversed, simply by rotating the Sensor 180° so that the face of the Sensor is facing the opposite magnetic Pole. This may also invert the relationship between the Magnetic Field and the ORMF.

As an example using Table 4, FIG. 15a, a 0.25-inch thick steel Target may have a −126 millivolt reading rather than the −103.4 millivolt reading shown in Table 4. This would indicate that the maximum holding force is 265 pounds-force rather than the expected 378 pounds-force for a 0.25-inch thickness. In this instance, the reduction in force may be due to any number of variables such as paint, finish thickness, surface roughness, warped material, a moderately magnetic alloy steel or combination thereof. Many factors have a dramatic impact on the magnetic attraction force. In all cases tested (for non-stacked Targets), the ORMF predictably represented the actual magnetic attractive force between the Magnetic Structure and the ferrous Target.

Air-gap testing has been performed repeatedly which demonstrates that the ORMF is highly representative of the actual breakaway performance under less than ideal conditions. This relationship holds true by comparing unusual shaped Target geometry relative to the data collected as well as predicting the performance of various alloys with lower magnetic performance. While some exceptions may be found where the ORMF is not representative of the actual Breakaway-Force, in most conditions, the data is highly correlate-able to the actual magnetic attractive force for the application. For those exceptions, an additional table can be created that reflects the performance characteristics. An example of this could be an unusual alloy that exhibits magnetic attachment performance that falls outside of the performance observed with normal steel Targets. If this alloy is expected to be used with the Magnetic Structure, a recalibration using the new alloy could readily be performed such that the data points would match the actual breakaway performance measured. Two sets of tables (or more) could be used for the differing alloys.

Another added benefit of the instant invention is that as the ORMF Sensing System slowly changes due to wear or surface damage of the Magnetic Structure, a recalibration can be performed at any time to allow for a continued accurate representation of the magnetic attraction performance, simply by running a calibration procedure on a periodic basis.

Other Embodiments

In the embodiments shown in FIG. 10 and FIG. 11, the ORMF Sensing System is further improved by the addition of a microcontroller with Analog to Digital (A/D) port integrated within a drill. The microcontroller in the embodiment continuously samples the Sensor voltage and performs the interpolation utilizing the table stored in its internal memory or a characteristic equation. This then displays the result on a digital readout or transmits the value over a wireless media such as Bluetooth or network protocol.

An ORMF Sensing System may be integrated into a magnetic drill as previously described in the U.S. Pat. No. 5,096,339 issued to Shoji (1992). In addition to the ability to shut off the drill should it detach during operation (provided by the Shoji patent), the instant technology allows a microprocessor the ability to monitor the magnetic field attachment level during operation. The operator now has constant feedback if excessive pressure is applied well before catastrophic detachment of the drill during operation. The ORMF Sensing System would also provide a means for the operator to adjust the applied downward drill force so that it is commensurate with the magnetic attachment level of the drill on a much wider range of Target thicknesses. The integration of a gauge or display showing the reduction of magnetic attachment force is now trivial for one skilled in the arts of circuit development. If integrated with a built in load cell or other load sensing technology, an ORMF Sensing System could be used to provide safe drilling on substantially thinner materials as well as provide optimal drill point pressure for an automated feed drill.

System Integration and Applications

A strain gauge or other type of sensor input may be used in conjunction with the sensing method to provide an operator or a microprocessor with information to be utilized to enhance operation and safety. For lifting magnets, by combining an estimated lifting capacity with sensor data from a load cell, a safety factor can readily be ascertained. Typical safety standards for switchable magnetic lifting normally mandate a three to one safety factor (not for overhead lifting). Due to frequent detachment of the load, several magnetics manufacturers are considering increasing the safety factor further as prior art methods of ascertaining the magnetic attachment force are inadequate.

With the instant technology, the ORMF is monitored continuously and any condition that may induce an air-gap such as impulse, peel, or material flexure could be detected early and while still at a low height. By combining the ORMF Sensing System data with data from a load sensor (external or internal to the Magnetic Structure), a comparison can be made at all times during the lifting operation between the actual weight of the Target and the attachment force of the Target to the Magnetic Structure. If the Target begins to shift, tilt, or peel away from the Magnetic Structure, an alarm or signal could be sent to alert the operator when the load is approaching or outside the desired safety factor.

The preferred embodiments described herein are merely illustrative and not exclusive, it being understood that one skilled in the art may deviate from one or more of the described preferred embodiments but still practice the instant invention.

What is claimed is:

1. A method for developing a sensing system to measure the attractive force between a magnetic structure and its target by quantifying the opposing residual magnetic field (ORMF), comprised of the following steps:
   i) employing a permanent magnet base comprised of a magnetic structure which in turn is comprised of one or more core elements, wherein each core element is comprised of one or more permanent magnets aligned in such a manner that the north pole face of each permanent magnet is adjacent to a pole conduit and conversely the south pole face of each permanent magnet is adjacent to a pole conduit;
   ii) placing the magnetic structure onto a ferromagnetic target of a given thickness;
   iii) activating the magnetic field of the magnetic structure;
   iv) employing a breakaway tester to measure the breakaway force required to detach the magnetic structure from a given thickness of the ferromagnetic target;
   v) determining the breakaway force for a given thickness of the ferromagnetic target;
   vi) changing the thickness of the ferromagnetic target from a given thickness to a changed thickness and measuring and determining the breakaway force required to detach the magnetic structure from the ferromagnetic target with the changed thickness;
   vii) continuing to change the thickness of the ferromagnetic target and measuring and determining the breakaway force required to detach the magnetic structure from the ferromagnetic target with each change of thickness until the measured and determined breakaway force no longer appreciably increases with an increase in the ferromagnetic target thickness;
   viii) selecting a field sensing means which is capable of measuring the magnetic field of the magnetic structure;
   ix) locating said field sensing means within said permanent magnet base such that said field sensing means is capable of measuring the magnetic field of the magnetic structure;
   x) sensing and measuring the magnetic field of the magnetic structure for various target thicknesses which may include a target thickness of zero for one or more field sensing means locations;
   xi) determining the magnetic field of the magnetic structure in correlation with field sensing means location, target thickness or breakaway force;
   xii) noting various field sensing means locations within said permanent magnet base with respect to the breakaway force and the magnetic fields determined;
   xiii) selecting the optimal field sensing means location within said permanent magnet base for various target thicknesses which may include a zero thickness target;
   xiv) verifying the optimal field sensing means location within said permanent magnet base by interpolating and confirming its accuracy by employing various target thicknesses;
   xv) correlating output of the field sensing means to a calculated breakaway force; and
   xvi) providing the breakaway force for the ferromagnetic target.

2. The method of claim 1 wherein said field sensing means comprises a Hall effect sensor.

3. The method of claim 1 wherein said core element is comprised of a shunting permanent magnet.

4. The method of claim 1 wherein said core element is comprised of a field or phase-cancelling switchable permanent magnet assembly which in turn is comprised of stationary and movable permanent magnets.

5. The method of claim 1 wherein said core element is comprised of a field or phase-cancelling switchable permanent magnet assembly which in turn is comprised of stationary and moveable permanent magnets, wherein moving the moveable permanent magnet activates, partially activates, or deactivates the magnetic field of the switchable permanent magnet assembly.

6. The method of claim 1 wherein said core element is comprised of an electro-magnet.

7. The method of claim 1 wherein the optimal field sensing means location is approximately centered between pole conduits of the core element such that the magnetic structure is between the ferromagnetic target and the field sensing means.

8. The method of claim 1 wherein the magnetic structure is comprised of a carrier platter assembly which in turn is comprised of one or more carrier platters comprised of a plurality of core elements.

9. The method of claim 1 wherein the field sensing means is comprised of a plurality of magnetic field sensors located at various locations.

10. The method of claim 1 wherein the field sensing means is comprised of a plurality of Hall effect sensors located at various locations.

11. The method of claim 1 wherein the weight of the ferromagnetic target is determined by a load cell, which weight is used in conjunction with the breakaway force for the ferromagnetic target.

12. The method of claim 1 wherein a strain gauge or other force quantifying means is used in conjunction with the breakaway force for the ferromagnetic target.

13. The method of claim 1 wherein the correlating output of the field sensing means is continuous.

14. The method of claim 1 wherein the correlating output of the field sensing means is intermittent.

15. The method of claim 1 wherein correlating output of the field sensing means is used to determine the breakaway force for different ferromagnetic target compositions.

16. The method of claim 1 wherein correlating output of the field sensing means can be used to determine the breakaway force when there is a gap between the ferromagnetic target and the magnetic structure.

17. A sensing system to measure the attractive force between a magnetic structure and its target by quantifying the opposing residual magnetic field (ORMF), comprised of:
   i) a permanent magnet base comprised of a magnetic structure which in turn is comprised of one or more core elements, wherein each core element is comprised of one or more permanent magnets aligned in such a manner that the north pole face of each permanent magnet is adjacent to a pole conduit and conversely the south pole face of each permanent magnet is adjacent to a pole conduit;

ii) a field sensing means located within said permanent magnet base such that said field sensing means is capable of measuring the residual magnetic field of the magnetic structure, wherein magnetic field measurements are correlated to various target thicknesses, which may include a zero thickness target, with the forces required to separate the magnetic structure from its ferromagnetic target, that is, their respective breakaway forces; and iii) a correlation means which uses interpolated field sensing means output and correlates the output to a breakaway force rather than material thickness, providing the breakaway force for the ferromagnetic target.

18. A method for developing a sensing system to measure the attractive force between a magnetic structure and its target by quantifying the opposing residual magnetic field (ORMF), comprised of the following steps:)

i) employing a permanent magnet base comprised of a magnetic structure which in turn is comprised of one or more core elements, wherein each core element is comprised of one or more permanent magnets aligned in such a manner that the north pole face of each permanent magnet is adjacent to a pole conduit and conversely the south pole face of each permanent magnet is adjacent to a pole conduit;

ii) activating the magnetic field of the magnetic structure;

iii) placing the magnetic structure onto a ferromagnetic target of a given thickness;

iv) determining the desired breakaway force required to detach the magnetic structure from the ferromagnetic target;

v) selecting a field sensing means which is capable of measuring the magnetic field of the magnetic structure;

vi) locating said field sensing means within said permanent magnet base such that said field sensing means is capable of measuring the magnetic field of the magnetic structure;

vii) measuring the magnetic field of the magnetic structure for a target thickness which achieves the desired breakaway force;

viii) establishing the relationship between the measured magnetic field of the magnetic structure and the desired breakaway force;

ix) verifying the accuracy of the field sensing means by evaluating the measured magnetic field of the magnetic structure above and below the desired breakaway force for various ferromagnetic target thicknesses; and x) communicating the field sensing means output.

\* \* \* \* \*